Aug. 9, 1966 R. H. WENTORF, JR 3,265,944
DIAMOND-CUBIC BORON NITRIDE P-N JUNCTION
Filed Aug. 31, 1961
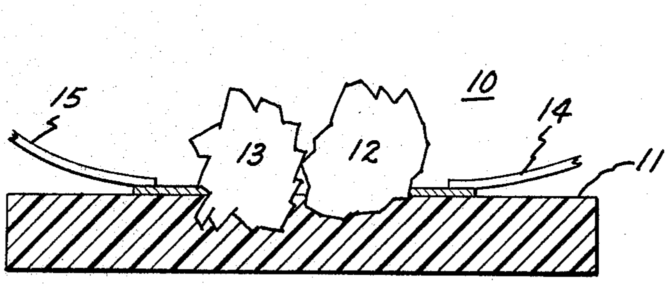
Inventor:
Robert H. Wentorf Jr.,
by Leo I. MaLossi
His Attorney.

United States Patent Office 3,265,944

Patented August 9, 1966

3,265,944

DIAMOND-CUBIC BORON NITRIDE P-N JUNCTION

Robert H. Wentorf, Jr., Schenectady, N.Y., assignor to General Electric Company, a corporation of New York Filed Aug. 31, 1961, Ser. No. 135,378
7 Claims. (Cl. 317—236)

This invention relates to an electrical p-n junction made with semiconducting diamond and more particularly to an asymmetrical or rectifier device utilizing p-type and n-type semiconductive crystals chosen from the group consisting of diamond and cubic form of boron nitride crystals.

Semiconductors are electronic conductors and electrical current in them may be carried by two types of charged particles. First, is the electron, a negatively charged particle of charge $4.80\times10^{-10}$ esu., and a mass of $9.11\times10^{-10}$ 28 g. Semiconductors in which electrons do the charge-carrying are called n-type or excess semiconductors. Semiconductors that conduct through positive hole conduction are p-type or defect semiconductors. This latter particle, whose existence depends upon the quantum mechanical effects in crystals, is similar to an electron in most respects, except that it has a positive charge. It usually also has a somewhat different effective mass than the electron although of the same order of magnitude. A p-type semiconductor and an n-type semiconductor may be suitably electrically connected in the form of a p-n junction, which is a boundary between two regions, one n-type and the other p-type. These semiconductor junctions may act as the essential part of a rectifier, a photoconductivity cell, or a photovoltaic cell, etc.

Among the most important semiconductive phenomena and also one of the first to be ordinarily applied and practiced, is that of contact rectification. Contact rectifiers are usually of two types, the first having, relative to the size of the conducting bodies, a small electrical contact area, and the second, a relatively large electrical contact area. The first is defined as a point contact rectifier, in which two semiconductors p-n are joined together with a point contact and, in the second, they are joined in order to have a surface or area contact known as a bulk junction. As one distinction, current density changes markedly through a point contact in contrast to generally little change through a bulk junction.

Because of the well known characteristics of semiconductors generally, they are very highly desirable elements for various electrical purposes. However, their use is limited, in one sense, by high temperatures which deleteriously affect their electrical properties, and they are also quite dependent upon the characteristics of the junction. A particularly desirable semiconductor junction device is one which is extremely durable and resistant to high temperature effects, and such a junction utilizing a diamond crystal and/or a cubic form of boron nitride crystal would have these desirable characteristics, because of the durability and high temperature stability of these crystals.

Accordingly, it is an object of this invention to provide an improved point contact p-n junction comprising crystals of the class of diamond and the cubic form of boron nitride.

It is another object of this invention to provide an improved point contact diamond p-n type semiconductor junction device.

It is another object of this invention to provide an improved point contact p-n type cubic form of boron nitride semiconductor junction device.

It is another object of this invention to provide an asymmetrical device incorporating a p-type semiconductive diamond and an n-type semiconductive cubic form of boron nitride crystal with point contact where the mentioned crystals have increased electrical conductivity obtained by means of atoms of an activator material incorporated in the crystal structure.

Briefly described, this invention includes a pair of semiconductive crystals taken from the class consisting of electrically conductive p-type diamond crystals and electrically conductive p and n-types of cubic form of boron nitride crystals which are placed in juxtaposed or joined relationship to provide a p-n junction whereby the value of an electrical current passing through said crystals in one direction differs from the value of electrical current passing through the crystals in a reverse direction.

This invention will be better understood when considered in connection with the following description and the drawing which schematically represents an exemplary rectification device utilizing the p-type and n-type crystals of this invention in point crystal-to-crystal contact relationship.

It has been discovered that semiconductive crystals of the cubic form of boron nitride and semiconductive crystals of diamond may be utilized to produce a rectifying effect when employed as p-n junctions. Each of the above-mentioned crystals is usually considered to be high pressure, high temperature product which require a high pressure, high temperature apparatus to produce them. It is of course understood that other means may be utilized to grow these crystals, the more common form being a high pressure, high temperature system. Various apparatuses are found in the prior art which are capable of providing the conditions of the processes involved. As an example, one preferred high temperature, high pressure apparatus is that disclosed in U.S. Patent 2,941,248, Hall. Briefly, such an apparatus includes an annular belt member having a convergent divergent aperture therethrough, and a pair of frusto-conical oppositely positioned and movable punches which move into said opening to define a reaction chamber. In the reaction chamber, a reaction vessel containing a specimen material is placed to be subjected to high pressures by motion of the punches, and to high temperatures by means of resistance heating of the material. Such a high pressure, high temperature apparatus is presently utilized in the commercial production of diamond crystal.

Diamond crystals are grown by high temperature, high pressure processes. A preferred method of producing, growing or making diamonds is adequately disclosed and claimed in U.S. Patents 2,947,610, Hall et al. and 2,947,609, Strong et al. Briefly described, the method of making diamonds includes the subjection of a non-diamond form of carbon, for example graphite, together with a catalyst, to sufficiently high pressures and temperatures in the diamond forming region of the phase diagram of carbon, to provide diamond growth. The catalyst is described as containing a metal, for example one of the metals of Group VIII of the Periodic Table of Elements, chromium, manganese, and tantalum.

Diamonds may also be grown as semiconductors utilizing the above-described apparatus and method of making diamonds. Such a method of making semiconductive diamond is disclosed and claimed in copending application Serial No. 130,439, Wentorf et al., filed August 9, 1961 (now U.S. Patent 3,148,161, and assigned to the same assignee as this invention. Briefly described, the method of making semiconductive diamond includes the method of making diamonds as previously described, but includes the use of an activator element in addition to the graphite-catalyst combination. The activator element may be, for example boron, aluminum, beryllium, etc. The subjection of the activator-catalyst-non-diamond form of carbon combination to pressures and temperatures in the diamond stable region of the phase diagram of carbon, results in semiconductive diamond crystals of the p-type. The measured resistivity of diamond crystals produced in accordance with the mentioned process is generally less than about $1 \times 10^8$ ohm centimeters as compared to about $1 \times 10^{10}$ to $1 \times 10^{12}$ ohm centimeters as usually found in natural diamonds. The aforementioned application is therefore incorporated by reference herein.

Semiconductive diamond may also be made by diffusion utilizing a high pressure, high temperature process. A diffusion process is disclosed and claimed in copending applications Serial No. 135,272, Wentorf (now U.S. Patent 3,141,855), and Serial No. 135,273, Cannon (now U.S. Patent 3,134,739), filed concurrently herewith, and assigned to the same assignee as this invention. The diffusion process of providing a semiconductive diamond crystal includes the subjection of a diamond crystal in combination with an activator material, for example boron, aluminum, etc., to high pressures and high temperatures in order that atoms of the activator material diffuse into the diamond crystal to provide a p-type diamond. The measured resistivity of diamond obtained by the mentioned process was less than about $1 \times 10^{10}$ ohm centimeters. The aforementioned applications are incorporated by reference herein.

The cubic form of boron nitride may also be produced by a high pressure, high temperature process using the high pressure apparatus above described. The method of making cubic form of boron nitride is adequately discloosed and claimed in U.S. Patent 2,947,617, Wentorf. Briefly described, the method of making a cubic form of boron nitride comprises, for example subjecting, to a temperature of about 1600° C. and a pressure of about 50,000 atmospheres, a mixture of ingredients comprising at least one catalyst metal selected from the class consisting of the alkali metals, alkali earth metals, lead antimony, tin, and nitrides of the foregoing metals, and a source of boron selected from the class consisting of elemental boron, hexagonal boron nitride, and compounds of boron decomposable to elemental boron at the elevated temperatures and pressures, and a source of nitrogen selected from the class consisting of hexagonal boron nitride and nitrogen containing compounds of the aforesaid catalyst materials which provide a source of nitrogen under temperatures and pressures used for effecting formation of the cubic crystal structure boron nitride.

A method of making semiconductive crystals of the cubic form of boron nitride is disclosed and claimed in copending applications Serial Nos. 111,279, 122,773, 53,225 and 2,978, Wentorf, filed May 19, 1961, July 10, 1961, August 31, 1960, and January 18, 1960, respectively, and assigned to the same assignee as the present invention. The aforementioned applications have matured into U.S. Patents 3,141,802; 3,216,942; 3,141,847; and 3,078,232, respectively. Briefly described, the method includes growing a cubic form of boron nitride in the presence of an activator material, such as silicon, germanium, selenium, sulfur, melamine, beryllium, etc. The use of the above activator elements, with the exception of beryllium, provides an n-type cubic form of boron nitride crystal. Use of beryllium provides a p-type crystal. These cubic boron nitride crystals have a lowered specific resistivity for example as low as about $5 \times 10^3$ ohm centimeters, as compared to about $1 \times 10^{12}$ ohm centimeters for unmodified cubic boron nitride. The above copending applications are accordingly incorporated by reference in this specification.

It has been discovered that a p-n point contact junction between semiconductive crystals taken from the class consisting of semiconductive diamond crystals and semiconductive crystals of the cubic form of boron nitride exhibit rectification effects when electrical current is passed therethrough in series. This rectification of electrical current is best described as follows. A pair of crystals, one p-type and one n-type, are electrically connected or joined in series relationship. Electrical connections are made to each crystal, one as positive and the other as negative, so that current may pass through the crystals in series relationship. The arrangement permits the passage of current therethrough more in one direction than in the opposite. It has also been discovered that this effect is attained between p and n type cubic form of boron nitride crystals and between p-type diamond and n-type cubic form of boron nitride crystals. Specific examples of the practice of this invention are given in the following table. In each instance the crystals were contacted with each other through one or more points whether point-surface or point-point by being placed in juxtaposed position between a pair of large silver probes. These crystals were blocky in shape and between 0.2 and 1.0 mm. in size. Measuring temperature was about 27° C. The p-type crystal was the positive terminal for the largest current. All crystals were obtained from the doping processes of providing semiconductivity as mentioned in the above copending applications. CFOBN is representative of cubic form of boron nitride.

TABLE 1

| No. | p-Type crystal | n-Type crystal | Rectification Ratio | Current Microamperes | Applied E.M.F. Volts |
|---|---|---|---|---|---|
| 1 | Be-doped CFOBN. | Melamine-doped CFOBN. | 4 | 1 | 4–6 |
| 2 | do | Pyridine-doped CFOBN. | 2–5 | 1–30 | 4–6 |
| 3 | do | 2-methyl Pyrazine-doped CFOBN. | 3 | 3–10 | 4–6 |
| 4 | do | Melamine-doped CFOBN. | 3 | 2 | 4–6 |
| 5 | do | Sulfur-doped CFOBN. | 20 | 1–10 | 4–6 |
| 6 | B-doped Diamond. | Si-doped CFOBN. | 2 | 1–2 | 4–6 |
| 7 | do | Se-doped CFOBN. | 2–4 | 2–4 | 4–6 |
| 8 | Al-doped Diamond. | S-doped CFOBN. | 40 | 0.1–40 | 4–28 |
| 9 | do | Si-doped CFOBN. | 2–100 | .01–50 | 4–50 |
| 10 | Natural Diamond B diffused in. | Se-doped CFOBN. | 1.3 | 10–20 | 5–6 |
| 11 | do | Si-doped CFOBN. | 1.3 | 4 | 28 |

The p and n-type crystals may be employed as an electrical junction rectifier device in various ways. One such simple device is shown in the drawing wherein the assembly 10 includes the use of general support means 11, which is electrically nonconductive, to support the p and n-type crystals 12 and 13 in point contact relationship for current rectification. The crystals themselves may be employed as the current connection terminals or suitable terminal members 14 and 15 may be suitably connected thereto.

There is thus provided by the teachings of this invention, an electrical p-n point contact junction device utilizing p and n-type crystals of diamond and cubic form of boron nitride. This junction acts as a rectifier or asymmetrical device by passing more current through the pair of crystals in series in one direction than in the opposite direction.

While a specific method and apparatus in accordance with this invention has been shown and described, it is not desired that the invention be limited to the particular description nor to the particular configurations illustrated, and it is intended by the appended claims to cover all modifications within the spirit and scope of this invention.

What I claim as new and desire to secure by Letters Patent of the United States is:

1. A point contact p-n type rectification junction comprising p- and n-type semiconducting crystals taken from the class consisting of diamond crystals and cubic form of boron nitride crystals, said crystals being electrically connected in crystal-to-crystal point contact relationship.

2. A point contact p-n type rectification junction comprising a p-type semiconducting diamond crystal and an n-type semiconducting diamond crystal, said diamond crystals being electrically connected in crystal-to-crystal point contact.

3. A point contact p-n type rectification junction comprising a p-type semiconducting cubic form of boron nitride crystal and an n-type semiconducting cubic form of boron nitride crystal, said crystals being electrically connected in crystal-to-crystal point contact relationship.

4. A point contact p-n type rectification junction comprising a p-type semiconducting diamond crystal and an n-type semiconducting cubic form of boron nitride crystal, said crystals being electrically connected in crystal-to-crystal point contact relationship.

5. A point contact p-n type rectification junction comprising a p-type semiconducting cubic form of boron nitride crystal and a n-type semiconducting diamond crystal, said crystals being electrically connected in crystal-to-crystal point contact relationship.

6. A point contact p-n type rectification junction comprising p- and n-type semiconducting crystals taken from the class consisting of diamond crystals and cubic form of boron nitride crystals, said crystals being electrically connected in crystal-to-crystal point contact relationship, and said crystals being characterized by containing different activator materials.

7. The p-n type rectification junction as recited in claim 6 wherein one of the semiconducting crystals is diamond made semiconductive by the presence of boron atoms therein.

References Cited by the Examiner

UNITED STATES PATENTS 2,798,989 7/1957 Welker ------------ 317—237

JOHN W. HUCKERT, *Primary Examiner.*

BENNETT G. MILLER, *Examiner.*

L. ZALMAN, R. F. POLISSACK, *Assistant Examiners.*